(12) United States Patent
Fanelli

(10) Patent No.: US 9,466,729 B1
(45) Date of Patent: Oct. 11, 2016

(54) ETCH STOP REGION BASED FABRICATION OF BONDED SEMICONDUCTOR STRUCTURES

(71) Applicant: QUALCOMM Incorporated, San Diego, CA (US)

(72) Inventor: Stephen A. Fanelli, San Marcos, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 14/707,367

(22) Filed: May 8, 2015

(51) Int. Cl.
| H01L 21/311 | (2006.01) |
| H01L 29/786 | (2006.01) |
| H01L 29/66 | (2006.01) |
| H01L 21/306 | (2006.01) |

(52) U.S. Cl.
CPC ... *H01L 29/78696* (2013.01); *H01L 21/30604* (2013.01); *H01L 29/66742* (2013.01)

(58) Field of Classification Search
CPC ............ H01L 21/26533; H01L 21/76243; H01L 21/76267; H01L 29/0623; H01L 21/30604; H01L 29/66742; H01L 21/311; H01L 21/28008; H01L 21/31155; H01L 29/7843; H01L 29/7841; H01L 29/7838; H01L 29/66553; H01L 29/78648; H01L 29/78621

See application file for complete search history.

(56) References Cited

U.S. PATENT DOCUMENTS

| 4,998,150 | A | | 3/1991 | Rodder et al. |
| 5,061,642 | A | | 10/1991 | Fujioka |
| 5,510,640 | A | * | 4/1996 | Shindo ............. H01L 21/76243 257/347 |
| 5,576,230 | A | * | 11/1996 | Guldi .................. H01L 21/266 257/E21.346 |
| 5,888,297 | A | | 3/1999 | Ogura |
| 5,906,708 | A | | 5/1999 | Robinson et al. |
| 5,930,642 | A | * | 7/1999 | Moore ............. H01L 21/26533 257/347 |
| 6,323,108 | B1 | | 11/2001 | Kub et al. |
| 6,335,214 | B1 | * | 1/2002 | Fung ................ H01L 29/78648 257/E21.415 |
| 6,437,404 | B1 | * | 8/2002 | Xiang ............... H01L 21/26533 257/347 |
| 6,503,778 | B1 | * | 1/2003 | Yamauchi .......... H01L 25/0657 257/E21.705 |
| 7,253,082 | B2 | | 8/2007 | Adachi et al. |
| 7,282,753 | B2 | | 10/2007 | Kub et al. |
| 7,459,025 | B2 | | 12/2008 | Lee |
| 7,495,250 | B2 | | 2/2009 | Enicks |

(Continued)

OTHER PUBLICATIONS

Yonehara and Sakaguchi, Eltran; Novel SOI Wafer Technology, JSAPI International, vol. 4, Jul. 2001.

(Continued)

*Primary Examiner* — Jarrett Stark
*Assistant Examiner* — Bitew Dinke
(74) *Attorney, Agent, or Firm* — Haynes and Boone, LLP

(57) ABSTRACT

Bonded semiconductor device structures and device structure fabrication processes to obviate the need for SOI wafers in many device fabrication applications are disclosed. In some examples, an etch stop layer is formed in situ during fabrication of an active device structure on a bulk semiconductor wafer. The etch stop layer enables the active device structure to be separated from the bulk semiconductor wafer in a layer transfer process in which the active device structure is bonded to a handle wafer. These examples enable the production of high-performance and low-power semiconductor devices (e.g., fully or partially depleted channel transistors) while avoiding the high costs of SOI wafers. In some examples, the gate masks the etch stop layer implant in a self-aligned process to create a fully depleted channel under the gate and deeper implants in the source and drain regions without requiring a separate masking layer.

22 Claims, 7 Drawing Sheets

(56) References Cited

U.S. PATENT DOCUMENTS

| | | | |
|---|---|---|---|
| 7,955,909 B2* | 6/2011 | Cheng | H01L 29/66545 257/E21.431 |
| 7,977,145 B2 | 7/2011 | Hannebauer | |
| 8,088,672 B2 | 1/2012 | Lee et al. | |
| 8,298,875 B1 | 10/2012 | Or-Bach et al. | |
| 8,367,512 B2 | 2/2013 | Fu et al. | |
| 8,466,036 B2 | 6/2013 | Brindle et al. | |
| 8,536,023 B2 | 9/2013 | Or-Bach et al. | |
| 2001/0020722 A1* | 9/2001 | Yang | H01L 21/26533 257/347 |
| 2005/0156246 A1 | 7/2005 | Lochtefeld et al. | |
| 2005/0245046 A1* | 11/2005 | Takafuji | H01L 27/1203 438/450 |
| 2005/0280122 A1* | 12/2005 | Arimura | H01L 29/32 257/632 |
| 2006/0068565 A1* | 3/2006 | Droes | H01L 21/76254 438/458 |
| 2007/0166922 A1 | 7/2007 | Surdeanu et al. | |
| 2007/0194387 A1 | 8/2007 | Dyer et al. | |
| 2008/0237716 A1 | 10/2008 | Enicks | |
| 2011/0127608 A1* | 6/2011 | Cheng | H01L 21/76251 257/347 |
| 2012/0146193 A1 | 6/2012 | Stuber et al. | |
| 2012/0161310 A1 | 6/2012 | Brindle et al. | |
| 2014/0106494 A1* | 4/2014 | Bedell | H01L 29/78648 438/49 |
| 2014/0151755 A1* | 6/2014 | Liu | H01L 29/66477 257/252 |
| 2014/0264467 A1* | 9/2014 | Cheng | G01N 27/4148 257/253 |

OTHER PUBLICATIONS

International Search Report and Written Opinion—PCT/US2016/026716—ISA/EPO—Jun. 24, 2016.

* cited by examiner

ETCH STOP REGION BASED FABRICATION OF BONDED SEMICONDUCTOR STRUCTURES

BACKGROUND

Silicon-on-insulator (SOI) device fabrication technologies use SOI wafers to fabricate a wide variety of different high-performance and low-power semiconductor devices and circuits. An SOI wafer typically has an electrically insulating buried oxide (BOX) layer between a top portion that includes a thin layer of silicon in which transistors and other active devices are formed and a bottom bulk silicon wafer. In some examples, all of the active device and integrated circuit processing is performed on the SOI wafer. As a result of the electrical isolation between the thin silicon layer and the bulk silicon wafer, these active devices tend to operate with higher performance and lower power than comparable devices that are fabricated directly on bulk silicon wafers. In other examples, a layer transfer process is used to transfer a top active device portion of an SOI wafer to a handle wafer. In this process, the top portion of the SOI wafer is bonded to the handle wafer, and the bulk substrate and BOX layer of the SOI wafer are removed. In some examples, the handle wafer includes one or more trap rich layers between the active device layer and the bulk substrate of the handle wafer to inhibit parasitic surface conduction and enhance the RF performance of one or more devices on the handle wafer as described in, e.g., U.S. Pat. No. 8,466,036.

Although SOI wafer based device fabrication technologies offer many benefits, the high cost of SOI wafers, as compared to bulk semiconductor wafers, limits the use of these fabrication methods to only a small sub-set of the possible semiconductor device markets.

SUMMARY

In some examples, a transistor is built in relation to a top portion of a semiconductor wafer that includes a substrate. In this process, a gate of the transistor is constructed, source and drain regions of the transistor are formed, and the source and drain regions of the transistor are annealed. After the gate is constructed but before an insulator is formed on the transistor, an etch stop dopant is implanted in the top portion of the semiconductor wafer to form an etch stop region below the transistor. The insulator is formed on the transistor. After the insulator is formed, a top surface of a handle wafer is bonded to the semiconductor wafer. After the bonding, a bottom substrate portion of the semiconductor wafer is removed. In this process, the bottom substrate portion of the semiconductor wafer is etched to the etch stop region.

In some examples, a fabricated structure is built on a portion of a semiconductor wafer that includes a substrate. The fabricated structure includes a transistor that has a gate, a source region, and a drain region. The gate of the transistor is formed on a surface of the portion of the semiconductor wafer and the source and drain regions of the transistor are formed in the portion of the semiconductor wafer. An etch stop dopant is implanted through the gate of the transistor and the surface of the portion of the semiconductor wafer to form an etch stop region in the portion of the semiconductor wafer below the transistor. In this process, the gate masks the implanting to produce a deeper implant in the source and drain regions of the transistor than in a channel region of the transistor. After the implanting, an insulator is formed on the transistor. After the insulator is formed, a handle wafer is bonded to the fabricated structure. After the bonding, a bottom substrate portion of the semiconductor wafer is removed. In this process, the bottom substrate portion of the semiconductor wafer is etched to the etch stop region.

In some examples, a semiconductor structure includes a portion of a semiconductor wafer that has a planar surface and an opposing surface that has a peripheral planar region surrounding a depression, where the portion of the semiconductor wafer between the planar surface and the peripheral planar region of the opposing surface is thicker than the portion of the semiconductor wafer between the planar surface and the depression. The semiconductor structure also includes a fabricated structure on the planar surface of the portion of the semiconductor wafer. The fabricated structure includes a transistor that has a gate, a source region, and a drain region. The gate of the transistor is on the planar surface aligned with and opposite the depression to create a channel of the transistor in the portion of the semiconductor wafer between the planar surface and the depression, and the source and drain regions of the transistor are in the portion of the semiconductor wafer between the planar surface and the peripheral planar region of the opposing surface. The semiconductor structure also includes a handle wafer bonded to a surface of the fabricated structure.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The examples that are described herein provide bonded semiconductor device structures and device structure fabrication processes to obviate the need for SOI wafers in many device fabrication applications. In some examples, an etch stop layer is formed in situ during fabrication of an active device structure on a bulk semiconductor wafer. The etch stop layer enables the active device structure to be separated from the bulk semiconductor wafer in a layer transfer process in which the active device structure is bonded to a handle wafer. These examples enable the production of high-performance and low-power semiconductor devices (e.g., fully or partially depleted channel, or thin channel transistors) while avoiding the high cost of SOI wafers. In some examples, the gate masks the etch stop layer implant in a self-aligned process to create a fully depleted channel under the gate and deeper implants in the source and drain regions without requiring a separate masking layer. Some examples also combine processing stages (e.g., concurrently annealing the etch stop implant and the source and drain implants) to achieve additional cost savings.

Figure 1:
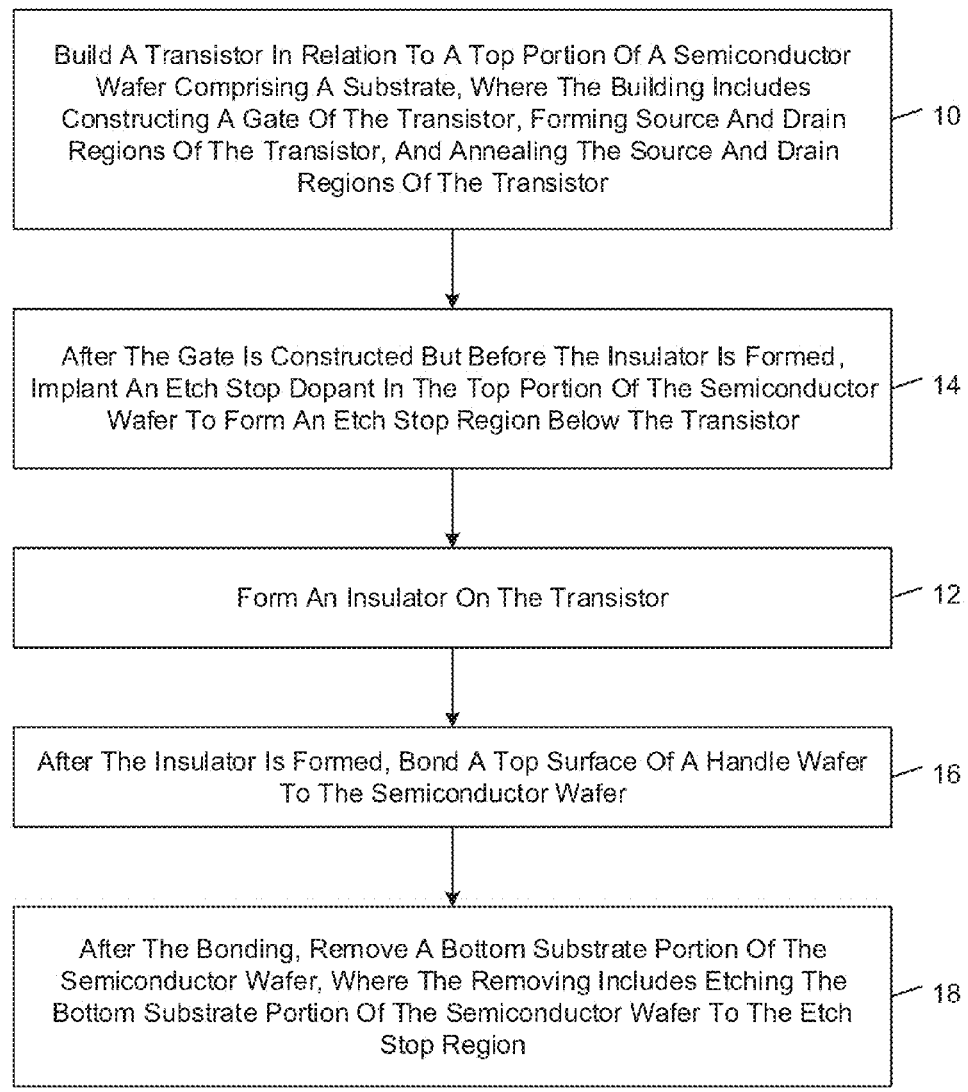
FIG. 1 is a flow diagram of an example of a method of fabricating a bonded semiconductor structure.

FIG. 1 shows an example of a method of fabricating a bonded semiconductor structure. In accordance with this method, a transistor is built in relation to a top portion of a semiconductor wafer that includes a substrate (FIG. 1, block 10). In this process, a gate of the transistor is constructed, source and drain regions of the transistor are formed, and the source and drain regions of the transistor are annealed. After the gate is constructed but before an insulator is formed on the transistor, an etch stop dopant is implanted in the top portion of the semiconductor wafer to form an etch stop region below the transistor (FIG. 1, block 14). The insulator is formed on the transistor (FIG. 1, block 12). After the insulator is formed on the transistor, a top surface of a handle wafer is bonded to the semiconductor wafer (FIG. 1, block 16). After the handle wafer is bonded to the top surface of the semiconductor wafer, a bottom substrate portion of the semiconductor wafer is removed (FIG. 1, block 18). In this process, the bottom substrate portion of the semiconductor wafer is etched to the etch stop region.

Figure 2A:
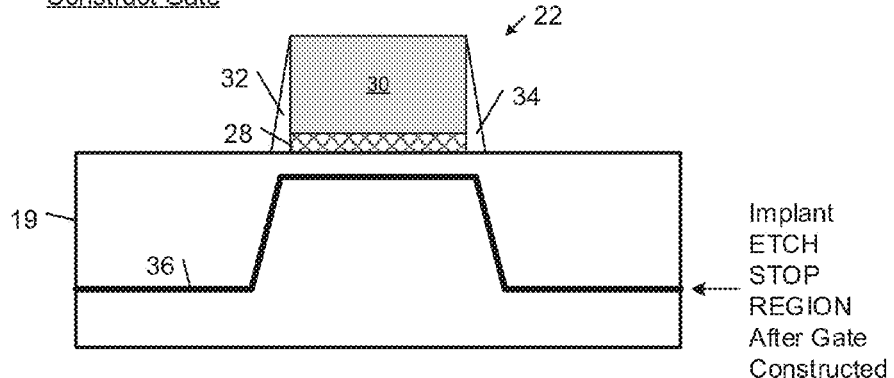
FIGS. 2A, 2B, and 2C are diagrammatic views of examples of semiconductor structures that have etch stop layers implanted at different respective stages in an example of a semiconductor structure fabrication process.
Figure 2B:
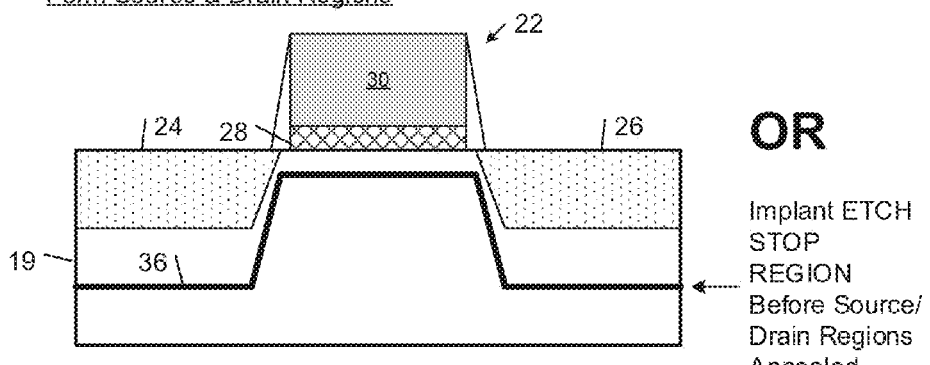
Figure 2C:
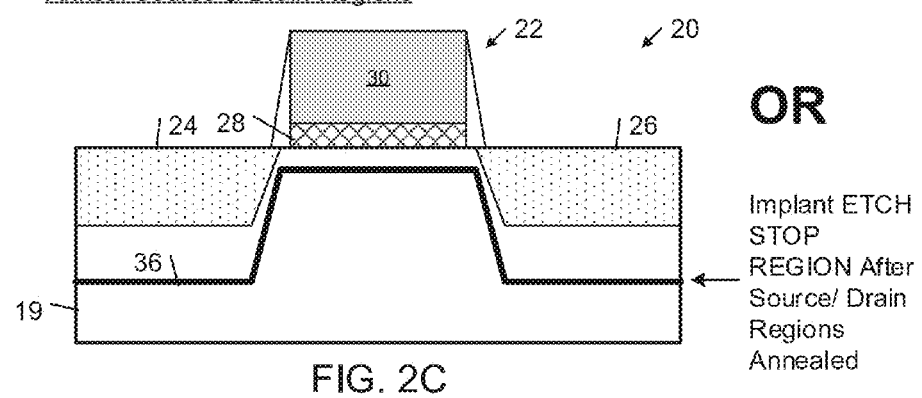

Referring to FIGS. 2A-2C, in the method of FIG. 1, the process of building a transistor 20 on a semiconductor wafer 19 (FIG. 1, block 10) involves (1) constructing a gate 22 of the transistor 20 (FIG. 2A), (2) forming source and drain regions 24, 26 of the transistor 20 (FIG. 2B), and (3) annealing the source and drain regions 24, 26 of the transistor 20 (FIG. 2C). The semiconductor wafer 19 can be a bulk semiconductor wafer such as a bulk silicon wafer. In this process, the gate 22 typically is formed over the top portion of the semiconductor wafer 19 and the source and drain regions 24, 26 typically are formed in the top portion of the semiconductor wafer.

Referring to FIG. 2A, the gate 22 of the transistor 20 is constructed by forming a thin insulator layer 28 (gate dielectric) on the semiconductor wafer 19, and forming an electrical conductor 30 (gate electrode) on the insulator layer 28. In the illustrated examples, the gate 22 also includes a pair of dielectric spacers 32, 34. In some examples, the insulator layer 28 is silicon dioxide, the electrical conductor 30 is polysilicon, and the semiconductor wafer 19 is a bulk silicon substrate.

Referring to FIG. 2B, the source and drain regions 24, 26 are formed by implanting a dopant into the semiconductor wafer 19. In some examples, a masking layer is deposited on the semiconductor wafer 19 to define the source and drain regions 24, 26. During the implantation, implantation of the source and drain regions 24, 26 occurs through openings in the masking layer, which otherwise blocks implantation of the dopant in the gate region and in other regions of the semiconductor wafer 19. In this process, the dielectric spacers 32, 34 modulate the implantation to taper the dopant profiles in the source and drain regions 24, 26 away from the gate region as a function of depth.

FIG. 2C shows the semiconductor wafer 19 after the source and drain regions 24, 26 of the transistor 20 have been annealed. In some examples, a rapid thermal process is performed to anneal the source and drain regions 24, 26 and thereby activate the implanted dopant species. In some examples, the rapid thermal process includes a thirty-second anneal at a peak temperature in the range of 600°-1100° C.

Each of the examples shown in FIGS. 2A-2C includes an etch stop region 36. A variety of different dopants may be used to form the etch stop region 36. In some examples, the etch stop dopant includes one or more of germanium, carbon, boron, nitrogen, argon, oxygen, and silicon. The etch stop dopant may be implanted (FIG. 1, block 14) at a variety of different stages in the process of building the transistor 20. In general, the implant region 36 should be formed after one or more of the high-temperature (e.g., temperatures above 600° C. thermal processing stages have been completed and before the insulator layer (e.g., interlayer dielectric layer, such as contact glass) has been formed on the transistor 20 (FIG. 1, block 12). In this way, significant diffusion of the etch stop dopant can be avoided to maintain a sufficient peak dopant concentration at a target depth to provide a viable etch stop. In some examples, the etch stop implant is performed towards the end of the front end-of-the-line (FEOL) portion of the integrated circuit (IC) fabrication process (i.e., the portion of the IC fabrication process in which the individual devices, such as transistors, capacitors, and resistors, are patterned in the semiconductor).

In the examples shown in FIGS. 2A-2B, the etch stop dopant 36 is implanted (FIG. 1, block 14) after the gate 22 is constructed but before the source and drain regions 24, 26 of the transistor 20 are annealed. For example, as shown in FIG. 2A, the etch stop dopant is implanted (FIG. 1, block 14) after the gate 22 is constructed but before the source and drain regions 24, 26 of the transistor 20 are formed. In contrast, the example depicted in FIG. 2B shows the etch stop dopant is implanted (FIG. 1, block 14) after the source and drain regions 24, 26 of the transistor 20 are implanted but before they are annealed. In the example of FIG. 2B, the source and drain regions 24, 26 of the transistor 20 and the implanted etch stop region 36 typically are annealed concurrently.

In the example shown in FIG. 2C, the etch stop dopant is implanted (FIG. 1, block 14) after the source and drain regions 24, 26 of the transistor 20 are annealed but before the insulator (e.g., the interlayer dielectric) is formed (FIG. 1, block 14). The inventors have found that the etch stop dopant does not have to be electrically activated (e.g., annealed) in order for the etch stop region 36 to work well as an etch stop.

In the illustrated examples, the etch stop dopant is implanted after the gate 22 is constructed but before the insulator is formed on the transistor. In these examples, the gate masks the implanting to produce a deeper implant in the source and drain regions of the transistor 20 than in the channel region under the gate 22 of the transistor 20, enabling transistors with very thin channels to be created.

In another example, the etch stop dopant is implanted before the gate 22 is constructed, but after a sacrificial oxide layer has been formed. Sacrificial oxide layers are often used as part of the isolation process for the wafer. As a result, sacrificial oxide layers are formed before the devices, and their gates, are fabricated. Sacrificial oxide layers are generally formed at higher temperatures than gate oxides so conducting the implant after the sacrificial oxide step still provides the benefit of implanting after a high temperature step. In addition, if the implant is conducted before the gate oxide is formed, potential damage to the gate oxide can be avoided as there is no need to implant ions through the gate oxide.

Figure 3A:
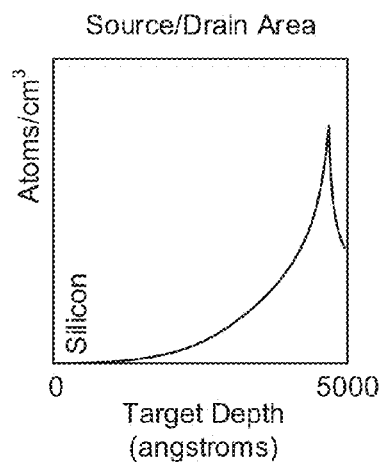
FIGS. 3A and 3B are schematic diagrams of simulated implant ion density as a function of depth for different semiconductor material layers.
Figure 3B:
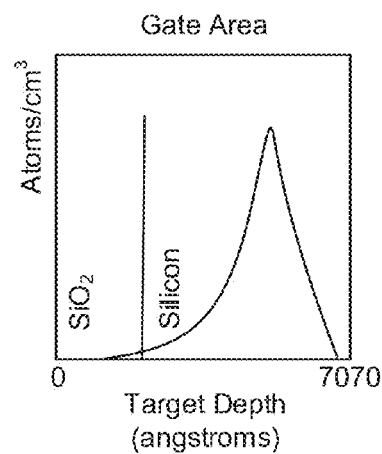

The formation of this beneficial etch stop region topology is demonstrated by the schematic diagrams of simulated implant ion density as a function of depth for different semiconductor materials shown in FIGS. 3A and 3B. In particular, FIG. 3A shows the ion density depth distribution for implanting boron into a source/drain area of a silicon substrate, and FIG. 3B shows the ion density depth distribution for implanting boron into a gate area consisting of a thin silicon dioxide layer on a silicon substrate. In the illustrated examples, the ion density ranges for the materials shown in FIGS. 3A and 3B are 404 nm and 491 nm, respectively.

Figure 4:
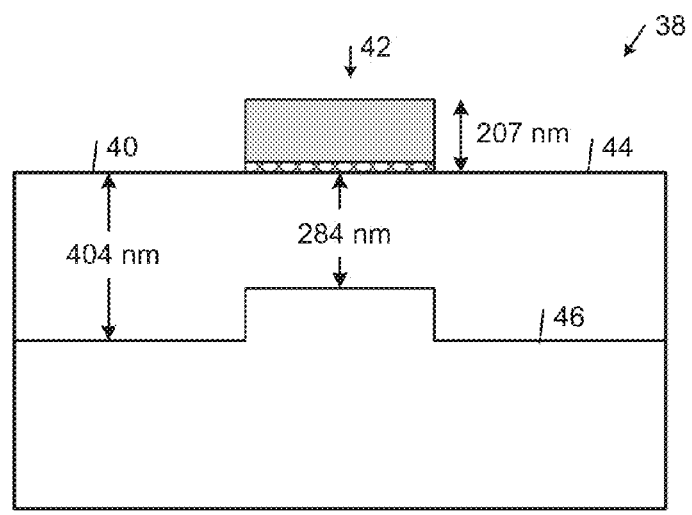
FIG. 4 is a diagrammatic view of an example of a semiconductor structure.

FIG. 4 shows the ion density ranges for source/drain and gate areas mapped to a schematic view of a semiconductor structure 38 consisting of a source area 40, a gate area 42, and a drain area 44. As shown in FIG. 4, the ion density range across the semiconductor structure 38 depicted by the line 46 (which corresponds to the etch stop region 36 shown in FIGS. 2A-2C) tracks the surface topology to produce a deeper implant in the source and drain areas 40, 44 of the transistor and a shallower implant in the channel region under the gate area of the transistor.

Figure 5:
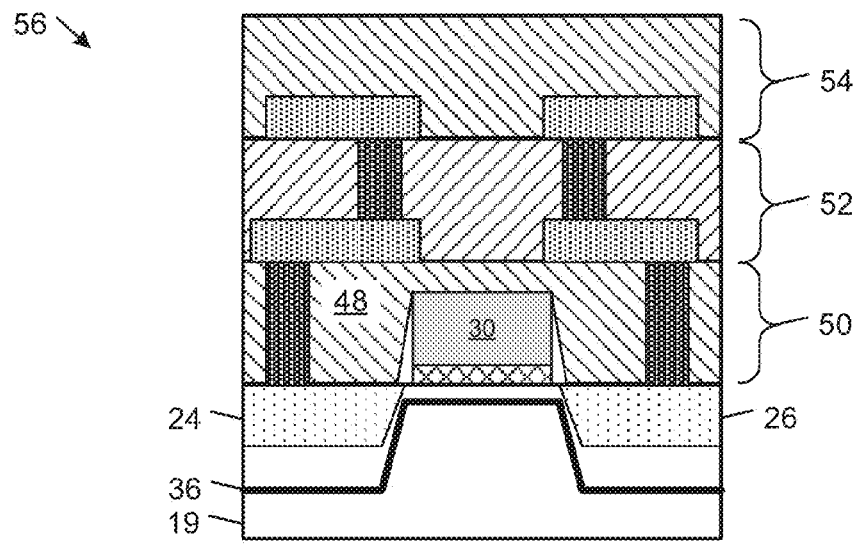
FIG. 5 is a diagrammatic view of an example of a semiconductor structure.

Referring to FIG. 5, after the transistor 20 has been built (FIG. 1, block 10), an insulator 48 is formed on the transistor (FIG. 1, block 12). As mentioned above, the insulator typically is an interlayer dielectric, such as tetraethyl orthosilicate (TEOS), or contact glass. The insulator 48 typically is part of an interconnect layer 50 that includes vias through which metal interconnects extend to connect the underlying active and passive devices to metallization layers and other on-chip devices and off-chip devices. Additional interconnect layers (not shown) and metallization layers 52, 54 may be formed on the interconnect layer 50.

Figure 6:
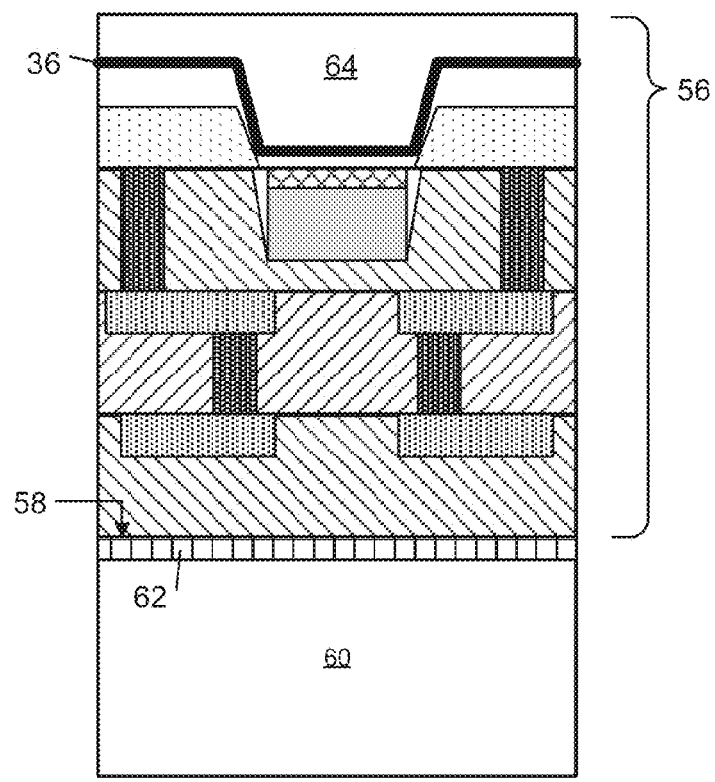
FIG. 6 is a diagrammatic view of an example of a bonded semiconductor structure.

Referring to FIG. 6, after the active and passive devices and structures have been formed on the semiconductor wafer 19, the resulting semiconductor structure 56 may then be bonded to a top surface 58 of a handle wafer 60 as part of a process to transfer the top portion of the semiconductor structure 56 to the handle wafer 60 (FIG. 1, block 16).

The handle wafer 60 typically is a bulk semiconductor wafer (e.g., a silicon wafer) that may or may not include additional layers and structures. In some examples, the handle wafer 60 includes one or more structures (e.g., cavities and other structural features) and one or more trap rich layers (TRLs) that inhibit parasitic surface conduction in the handle wafer 60 to enhance the RF performance of devices formed in the semiconductor structure 56. Briefly, the one or more TRLs reduce nonlinear parasitic capacitance and parasitic surface conduction in the handle wafer substrate. The one or more structures, on the other hand, further reduce the impact of non-linear responses in the handle wafer substrate by reducing the permittivity and increasing the resistivity between the one or more devices and the handle wafer substrate to reduce capacitive interactions between the one or more devices and the handle wafer substrate. Additional details regarding the structure and operation of the TRLs and permittivity reducing and resistivity increasing structures are described in U.S. patent application Ser. No. 14/633,024, filed Feb. 26, 2015, which is incorporated herein by reference.

The top surface 58 of the handle wafer 60 typically is bonded to the top portion of the semiconductor structure 56 using wafer bonding or other layer transfer techniques. In some examples, the handle wafer 60 includes on its top surface 58 an exposed bonding layer 62 that is used to bond the handle wafer 60 to the top surface of the semiconductor structure 56. The bonding layer 62 may be formed from a combination of one or more insulator layers and passivation layers. In some examples, the bonding layer is an oxide layer that is formed by chemical vapor deposition (CVD) or thermal oxidation.

Figure 7A:
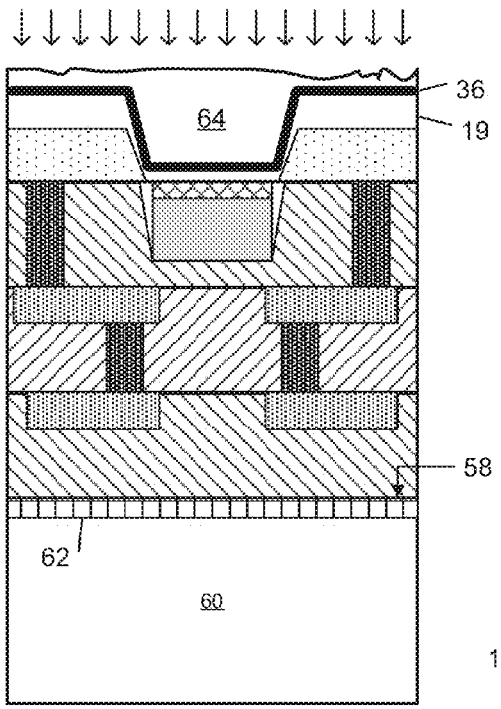
FIGS. 7A, 7B, and 7C are diagrammatic views of an example of the bonded semiconductor structure after different respective processing stages.

After the handle wafer 60 has been bonded to the top portion of the semiconductor structure 56 (FIG. 1, block 16), a bottom substrate portion 64 (e.g., the bottom bulk portion) of the semiconductor wafer 19 is removed to the etch stop region 36. In some examples, a thinning process (e.g., mechanical grinding, mechanical polishing, rapid wet etch, plasma etch, chemical-mechanical polish, or other wafer thinning process) is used to thin the bottom substrate portion 64 of the semiconductor wafer 19 is as shown in FIG. 7A. In other examples, the thinning process can involve a combination of any of the above thinning processes. In particular, the bottom substrate portion can be thinned using a combination of wafer grinding followed by a plasma or wet etch.

Figure 7B:
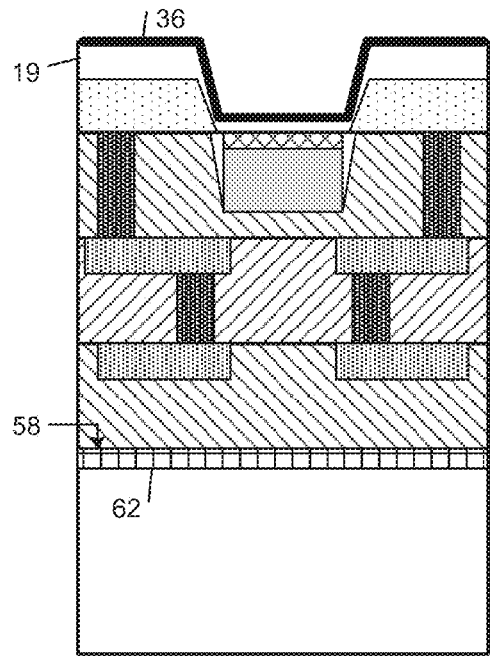

The thinning process is followed by a chemical etching process that etches the remaining bottom substrate portion 64 of the semiconductor wafer 19 to the etch stop region 36 as shown in FIG. 7B. The type of etching process used will depend on the composition of the semiconductor wafer 19 and the composition of the etch stop region 36. In general, the etching process should be highly selective between the semiconductor wafer 19 and the etch stop region 36. In some examples, the semiconductor wafer is a bulk silicon wafer and the etch stop dopant includes one or more of germanium, carbon, nitrogen, argon, oxygen, and boron. In some of these examples, TMAH (Tetramethylammonium Hydroxide) is used to etch the bottom portion of the bulk silicon wafer because it has a high selectivity to doped silicon such that it etches the undoped silicon substrate and effectively stops on the doped silicon etch stop region 36.

Figure 7C:
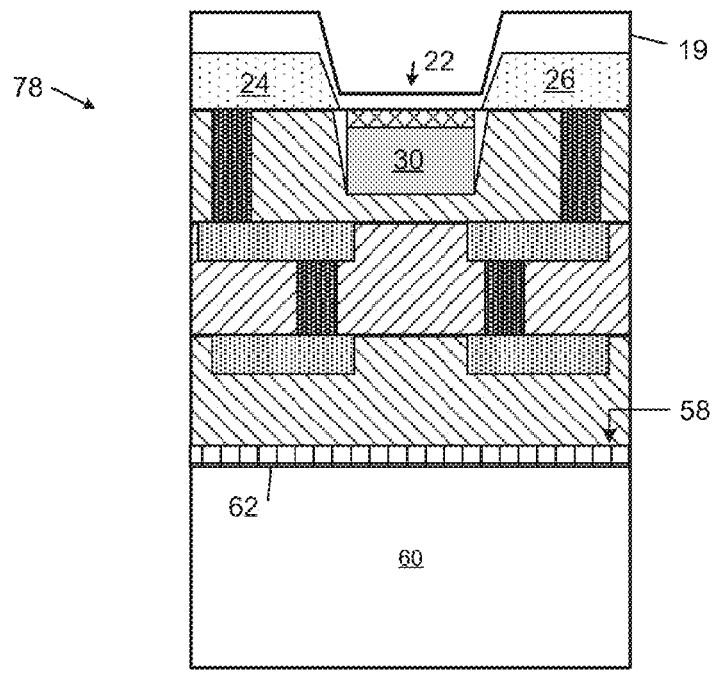

After the bottom substrate portion of the semiconductor wafer has been removed up to the etch stop region 36, the etch stop region 36 is etched to expose a bottom side of the top portion of the semiconductor wafer 19 as shown in FIG. 7C. The etching of the etch stop region 36 typically is conducted using a different etchant having a different chemistry than the etchant used to etch the bulk semiconductor wafer 19. In examples in which the semiconductor wafer is a bulk silicon wafer and the etch stop dopant includes one or more of germanium, carbon, nitrogen, argon, oxygen, and boron—HNA (Hydrofluoric acid, Nitric acid, Acetic acid) is an example of an etchant that could be used to etch the etch stop region 36 because it etches highly doped silicon and is selective to lightly doped silicon.

As shown in FIG. 7C, after etching the etch stop region 36, the source and drain regions 24, 26 of the top portion of the resulting bonded semiconductor structure 78 are thicker than the gate region 22 of the top portion of the semiconductor wafer 19. This structure 78 enables the beneficial low-power and high-performance device characteristics mentioned above.

Figure 8:
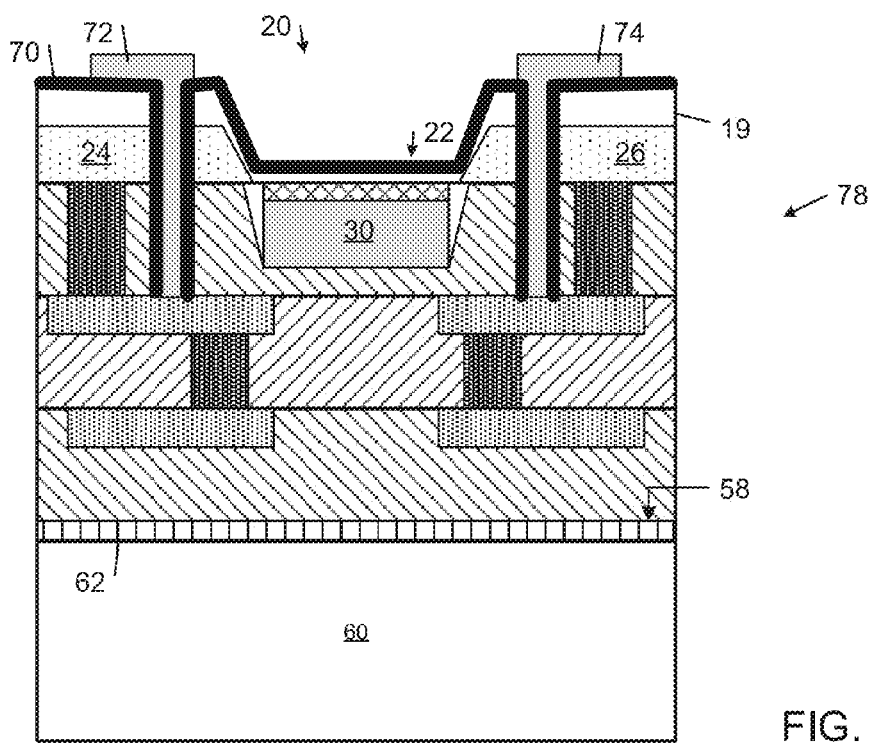
FIG. 8 is a diagrammatic view of an example of a bonded semiconductor structure formed after the different processing stages of FIGS. 7A-7C.

Referring to FIG. 8, after the etch stop region 36 has been etched, a passivation layer 70 (e.g., a dielectric layer) is formed over the exposed bottom side of the top portion of the semiconductor wafer 19. In addition, contacts 72, 74 for the transistor 20 are formed on the exposed bottom side of the top portion of the semiconductor wafer 19. Although not clearly reflected in the view shown in FIG. 8, the contacts 72, 74 extend down through the structure in a plane that is outside the conductive path between the source and drain regions 24, 26 under the gate 22. As drawn, contacts 72, 74 extend to the interconnect layer of the device and make contact to a lowest layer of conductive material in that layer. In some examples, this lowest layer of conductive material is referred to as "metal 1" to reference the fact that it is the first layer of metallization in the related process. Alternatively, the contacts 72, 74 could terminate in the source and drain regions 24, 26. In those situations, the contacts could be within the same plane as that occupied by the conductive path between source and drain regions 24, 26 or it could be outside that plane as mentioned before with regards to approaches where the contacts extend to the interconnect layer.

Figure 9:
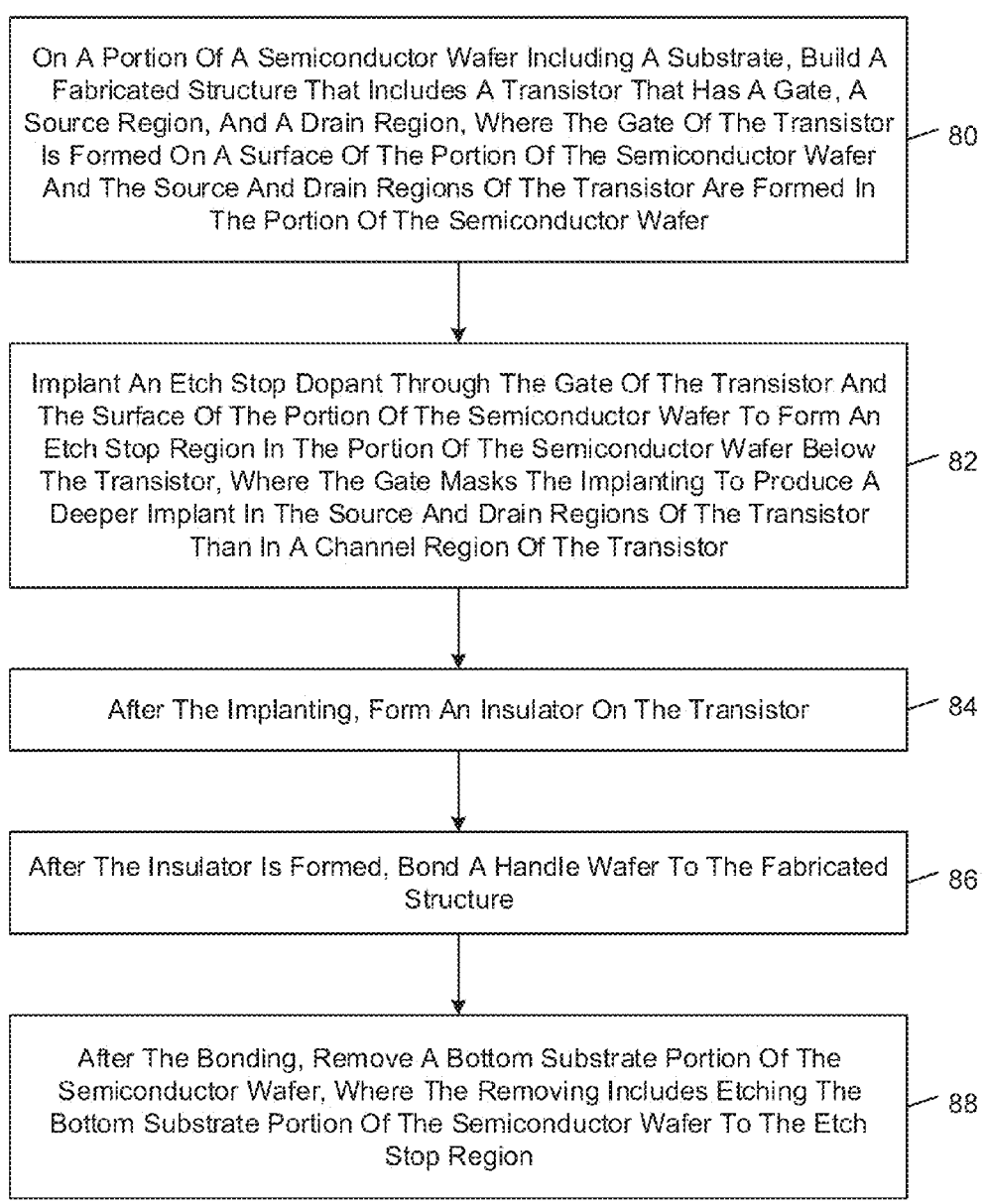
FIG. 9 is a flow diagram of an example of a method of fabricating a bonded semiconductor structure.

FIG. 9 shows an example of another method of fabricating the bonded semiconductor structure 78 shown in FIG. 7C. In accordance with this method, a fabricated structure 56 is built on a portion of a semiconductor wafer 19 that includes a substrate (FIG. 9, block 80). The fabricated structure includes a transistor 20 that has a gate 22, a source region 24, and a drain region 26. The gate 22 of the transistor 20 is formed on a surface of the portion of the semiconductor wafer 19 and the source and drain regions 24, 26 of the transistor 20 are formed in the portion of the semiconductor wafer 19. An etch stop dopant is implanted through the gate 22 of the transistor 20 and the surface of the portion of the semiconductor wafer 19 to form an etch stop region 36 in the portion of the semiconductor wafer 19 below the transistor 20, where the gate 19 masks the implanting to produce a deeper implant in the source and drain regions 24, 26 of the transistor 20 than in a channel region of the transistor 20 (FIG. 9, block 82) (see, e.g., FIGS. 2A-2C). After implanting the etch stop dopant, an insulator 48 is formed on the transistor 20 (FIG. 9, block 84) (see, e.g., FIG. 5). After the insulator 48 is formed, a handle wafer 60 is bonded to the fabricated structure 56 (FIG. 9, block 86) (see, e.g., FIG. 6). After the handle wafer 60 is bonded to the fabricated structure 56, a bottom substrate portion of the semiconductor wafer 19 is removed (FIG. 9, block 88). The process of removing the bottom substrate portion includes etching the bottom substrate portion of the semiconductor wafer 19 to the etch stop region 36 (see, e.g., FIGS. 7A-7C).

The invention claimed is:

1. A method, comprising:
building a transistor in relation to a top portion of a bulk semiconductor wafer comprising a substrate, the top portion including a semiconductor surface, wherein the building comprises constructing a gate of the transistor on the semiconductor surface, forming source and drain regions of the transistor, and annealing the source and drain regions of the transistor;
forming an insulator on the transistor;
after the gate is constructed but before the insulator is formed, implanting an etch stop dopant in the top portion of the semiconductor wafer to form an etch stop region below the transistor;
after the insulator is formed, bonding a top surface of a handle wafer to the semiconductor wafer; and
after the bonding, removing a bottom substrate portion of the semiconductor wafer, wherein the removing comprises etching the bottom substrate portion of the semiconductor wafer to the etch stop region to form a depression that extends between the source and drain regions.

2. The method of claim 1, wherein the implanting is performed before the source and drain regions of the transistor are annealed.

3. The method of claim 2, wherein the source and drain regions of the transistor and the implanted etch stop dopant are annealed concurrently.

4. The method of claim 1, wherein the implanting is performed before the source and drain regions of the transistor are formed.

5. The method of claim 4, wherein:
the gate masks the implanting to produce a deeper implant in the source and drain regions of the transistor than in a channel region of the transistor; and
the channel region is below the gate of the transistor and in the top portion of the semiconductor wafer.

6. The method of claim 5, wherein:
etching the bottom substrate portion of the semiconductor wafer to the etch stop region forms the depression on the backside of the top portion of the semiconductor wafer that is aligned with the channel region of the transistor.

7. The method of claim 1, wherein the constructing comprises forming a gate electrode over a gate dielectric.

8. The method of claim 1, further comprising:
before the bonding, electrically interconnecting the transistor with one or more other devices formed on the semiconductor wafer.

9. The method of claim 1, further comprising:
after the removing, etching the etch stop region to expose a bottom side of the top portion of the semiconductor wafer;
wherein the removing and etching are conducted using a set of two etchants with different chemistries.

10. The method of claim 9, wherein:
after the etching, the source and drain regions of the top portion of the semiconductor wafer are thicker than the gate region of the top portion of the semiconductor wafer.

11. The method of claim 9, further comprising:
after etching the etch stop region, forming a passivation layer over the exposed bottom side of the top portion of the semiconductor wafer.

12. The method of claim 9, further comprising:
after etching the etch stop region, forming contacts for the transistor on the exposed bottom side of the top portion of the semiconductor wafer.

13. The method of claim 1, wherein the semiconductor wafer is a bulk silicon wafer.

14. The method of claim 13, wherein the etch stop dopant comprises one or more of germanium, carbon, nitrogen, argon, oxygen, and boron.

15. The method of claim 1, wherein the handle wafer comprises a trap rich layer.

16. A method, comprising:
on a portion of a bulk semiconductor wafer comprising a substrate including a semiconductor surface, building a fabricated structure comprising a transistor that comprises a gate, a source region, and a drain region, wherein the gate of the transistor is formed on the semiconductor surface of the portion of the semiconductor wafer and the source and drain regions of the transistor are formed in the portion of the semiconductor wafer;
implanting an etch stop dopant through the gate of the transistor and the semiconductor surface of the portion of the semiconductor wafer to form an etch stop region in the portion of the semiconductor wafer below the transistor, wherein the gate masks the implanting to produce a deeper implant in the source and drain regions of the transistor than in a channel region of the transistor;

after the implanting, forming an insulator on the transistor;

after the insulator is formed, bonding a handle wafer to the fabricated structure; and after the bonding, removing a bottom substrate portion of the semiconductor wafer, wherein the removing comprises etching the bottom substrate portion of the semiconductor wafer to the etch stop region to form a depression that extends between the source region and the drain region.

17. The method of claim 16, wherein the building comprises doping portions of the semiconductor wafer corresponding to the source and drain regions of the transistor, and the implanting is performed before the doping.

18. The method of claim 17, further comprising concurrently annealing the doped portions of the semiconductor wafer and the implanted etch stop dopant.

19. The method of claim 16, wherein the building comprises doping portions of the semiconductor wafer corresponding to the source and drain regions of the transistor, annealing the doped portions of the semiconductor wafer, and the implanting is performed before the source and drain regions of the transistor are annealed.

20. The method of claim 16, further comprising:

after the removing, etching the etch stop region to expose a surface of the portion of the semiconductor wafer having a peripheral planar region surrounding a depression.

21. The method of claim 1, wherein forming the source and drain regions comprises modulating implanting of respective source and drain dopants such that profiles of the source and drain regions taper in opposite directions away from the gate region.

22. The method of claim 1, wherein an ion density range associated with the gate and the source and drain regions of the transistor corresponds in shape with the etch stop region.

* * * * *